United States Patent
Yeh

(10) Patent No.: US 6,859,103 B2
(45) Date of Patent: Feb. 22, 2005

(54) BIAS CIRCUIT FOR IMPROVING LINEARITY OF A RADIO FREQUENCY POWER AMPLIFIER

(75) Inventor: Ping-chun Yeh, Taichung (TW)

(73) Assignee: Delta Electronics, Inc. (TW)

( * ) Notice: Subject to any disclaimer, the term of this patent is extended or adjusted under 35 U.S.C. 154(b) by 13 days.

(21) Appl. No.: 10/646,028

(22) Filed: Aug. 22, 2003

(65) Prior Publication Data

US 2004/0251966 A1 Dec. 16, 2004

(30) Foreign Application Priority Data

Jun. 11, 2003 (TW) ...................................... 92210654 U

(51) Int. Cl.$^7$ ............................. H03G 3/10; H03F 3/04
(52) U.S. Cl. ..................... 330/285; 330/296; 330/302
(58) Field of Search ................................ 330/285, 296, 330/302

(56) References Cited

U.S. PATENT DOCUMENTS 6,333,677 B1 * 12/2001 Dening ....................... 330/296
6,476,668 B2 * 11/2002 Gharpurey et al. .......... 327/538
6,556,085 B2 * 4/2003 Kwon et al. ................. 330/311
6,653,902 B1 * 11/2003 Bachhuber et al. .......... 330/285

\* cited by examiner

Primary Examiner—Patricia Nguyen
(74) Attorney, Agent, or Firm—Martine & Penilla, LLP

(57) ABSTRACT

A bias circuit is provided for improving linearity of a radio frequency power amplifier. The bias circuit includes a bias transistor having a collector, an emitter, and a base. The collector is connected to a DC voltage source, the emitter is connected to a radio frequency transistor, and the base is connected to a bias voltage source. A capacitor and an inductor are connected in series and are coupled either between the emitter of the bias transistor and ground or between the base of the bias transistor and ground, thereby constructing an LC series-connected resonator circuit. The LC series-connected resonator circuit directly conducts the part of the radio frequency input signal, which is coupled back to the bias transistor, into the ground, thereby improving linearity of the radio frequency power amplifier. Preferably, the LC series-connected resonator circuit is designed to have a resonant frequency, which is equal to a frequency of a second harmonic component of the radio frequency input signal.

12 Claims, 2 Drawing Sheets

US 6,859,103 B2

BIAS CIRCUIT FOR IMPROVING LINEARITY OF A RADIO FREQUENCY POWER AMPLIFIER

BACKGROUND OF THE INVENTION

1. Field of the Invention

The present invention relates to a bias circuit for a radio frequency power amplifier, and more particularly, to a bias circuit for improving linearity of a radio frequency power amplifier.

2. Description of the Related Art

FIG. 1 is a schematic diagram showing an example of a conventional bias circuit for a radio frequency (RF) power amplifier. Referring to FIG. 1, in a conventional resistive bias circuit, a bias voltage source Vbias is supplied to a base of an RF transistor 102 through a bias resistor 104, thereby providing a base current of the RF transistor 102. A capacitor 106 is connected between an RF input port of the RF power amplifier and the base of the RF transistor 102, thereby coupling an RF input signal (but not a direct-current signal) to the base of the RF transistor 102. Through an output matching circuit 108, a collector of the RF transistor 102 functions as an output port of the RF power amplifier. The resistive bias circuit has a disadvantage of providing a limit control over the bias current. For example, if the bias resistor 104 has a small resistance, temperature variations will cause unacceptable fluctuations in the quiescent current unless the bias voltage source Vbias also changes with temperature. On the other hand, if the bias resistor 104 has a large resistance, the RF transistor 102 will have insufficient bias current at high drive levels or have a large quiescent bias current which is undesirable.

FIG. 2 is a schematic diagram showing another example of a conventional bias circuit for an RF power amplifier. A conventional active bias circuit shown in FIG. 2 is an improvement of the resistive bias circuit shown in FIG. 1. Referring to FIG. 2, the active bias circuit includes a bias transistor 202 for allowing the RF transistor 102 to draw varying amounts of bias current depending on the RF drive level while still maintaining a low quiescent current level. The bias voltage source Vbias is supplied to a base of the bias transistor 202 through the bias resistor 104. The bias transistor 202 is an emitter-follower-type transistor. A collector of the bias transistor 202 is connected to a DC voltage Vcc. The active bias circuit further has an advantage of low impedance.

However, the active bias circuit shown in FIG. 2 has a disadvantage that the bias transistor 202 may be driven into a saturation state. More specifically, when the RF transistor 102 are driven to output a high power, part of the RF input signal is reflected from the collector of the RF transistor 102 back to the base of the RF transistor 102, and may further enter the active bias circuit. As a result, the bias transistor 202 is driven into the saturation state by the part of the RF input signal coupled back to the bias transistor 202, causing its operation to become more nonlinear. Under this circumstance, the active bias circuit cannot follow the RF input signal to provide the RF transistor 102 with a linear bias current.

SUMMARY OF THE INVENTION

In view of the above-mentioned problem, an object of the present invention is to provide a bias circuit capable of conducting a second harmonic component of an RF input signal into the ground in order to prevent a bias transistor from being influenced by an RF input signal, thereby improving linearity of the RF power amplifier.

According to one aspect of the present invention, a bias circuit for improving linearity of a radio frequency power amplifier is provided. The RF power amplifier includes an RF transistor and a first capacitor. The RF transistor has a collector, an emitter, and a base. The first capacitor has a terminal connected to the base of the RF transistor and another terminal for receiving an RF input signal. The bias circuit includes a bias transistor, a second capacitor, and a first inductor. The bias transistor has a collector, an emitter, and a base, the collector being connected to a DC voltage source and the base being connected to a bias voltage source. The second capacitor has a first terminal and a second terminal, the first terminal being connected to the emitter of the bias transistor. The first inductor has a third terminal and a fourth terminal, the third terminal being connected to the second terminal of the second capacitor and the fourth terminal being connected to a ground. The second capacitor and the first inductor construct a first LC series-connected resonator circuit for directly conducting part of the RF input signal coupled to the bias transistor into the ground, thereby improving linearity of the RF power amplifier.

According to another aspect of the present invention, a second inductor is further connected between the base of the RF transistor and the emitter of the bias transistor for blocking part of the RF input signal coupled to the bias transistor.

Preferably, the first LC series-connected resonator circuit is designed to have a resonant frequency equal to a frequency of a second harmonic component of the RF input signal.

According to still another aspect of the present invention, the bias circuit further comprises a third capacitor and a third inductor. The third capacitor has a fifth terminal and a sixth terminal, the fifth terminal being connected to the base of the bias transistor. The third inductor has a seventh terminal and an eighth terminal, the seventh terminal being connected to the sixth terminal of the third capacitor and the eighth terminal being connected to a ground. The third capacitor and the third inductor construct a second LC series-connected resonator circuit for directly conducting part of the RF input signal coupled to the bias transistor into the ground, thereby improving linearity of the RF power amplifier.

Preferably, the second LC series-connected resonator circuit is designed to have a resonant frequency equal to a frequency of a second harmonic component of the RF input signal.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
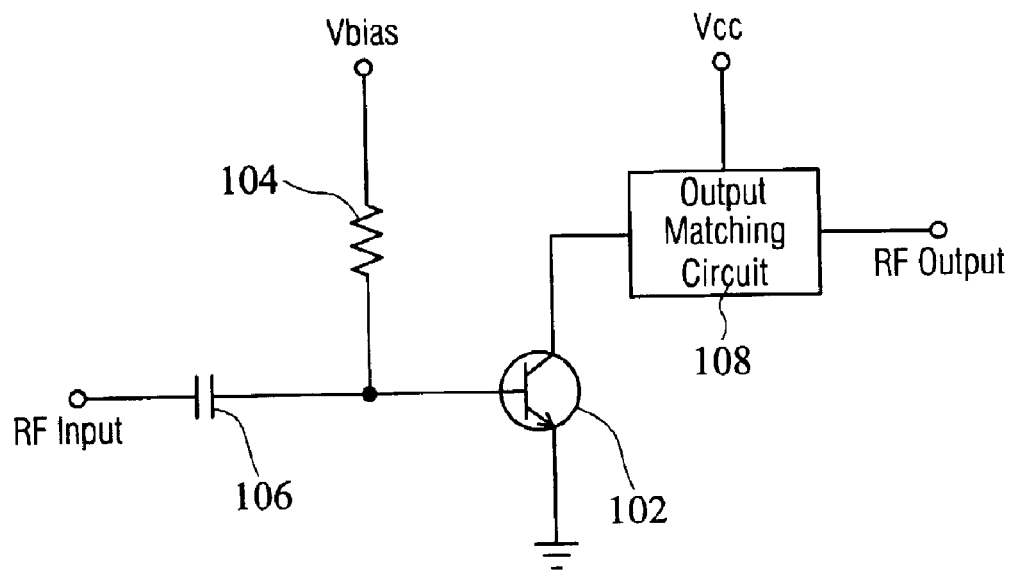
FIG. 1 is a schematic diagram showing an example of a conventional bias circuit for an RF power amplifier.
Figure 2:
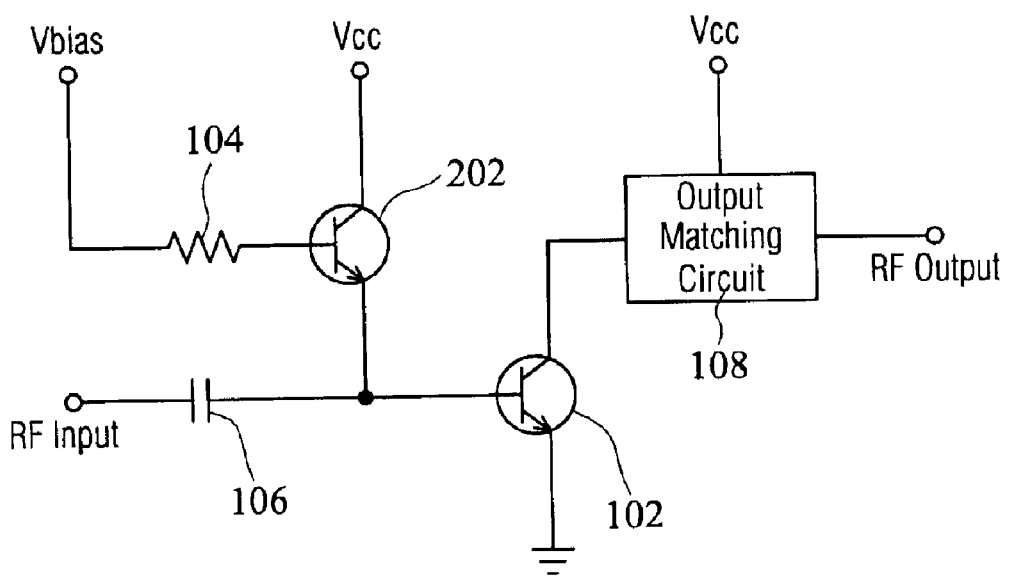
FIG. 2 is a schematic diagram showing another example of a conventional bias circuit for an RF power amplifier.
Figure 3A:
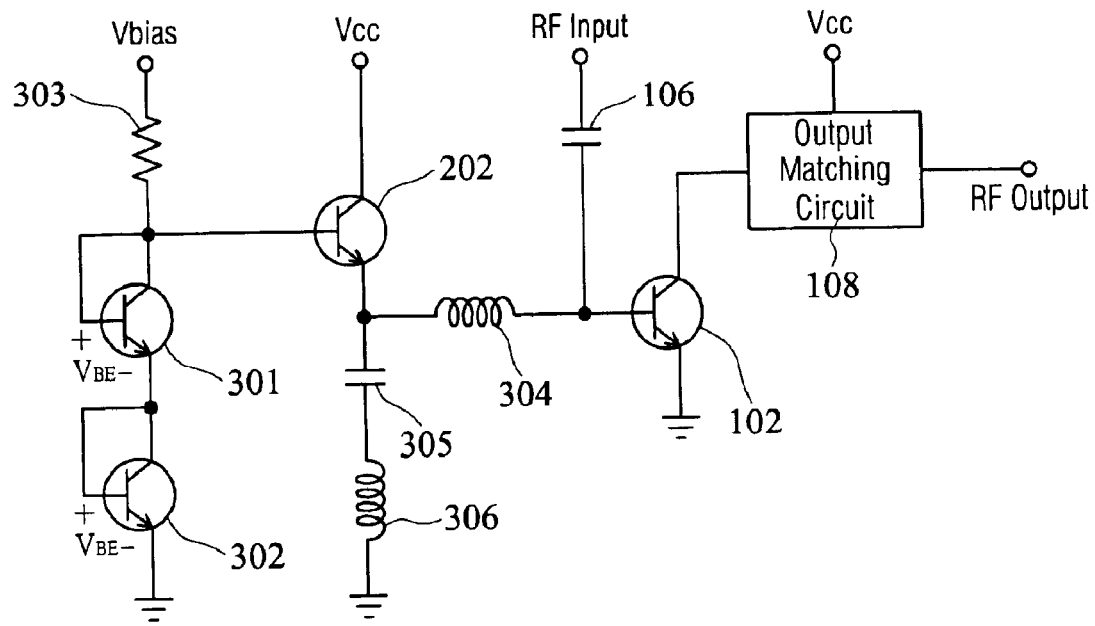
FIG. 3(a) is a schematic diagram showing a bias circuit according to a first embodiment of the present invention.

FIG. 3(a) is a schematic diagram showing a bias circuit for improving linearity of a radio frequency power amplifier according to a first embodiment of the present invention. Referring to FIG. 3(a), in the bias circuit according to the first embodiment of the present invention, a bias voltage source Vbias supplies current through a resistor 303 to diode-connected transistors 301 and 302 which are connected in series. More specifically, each of the diode-connected transistors 301 and 302 has a configuration that a base thereof is connected to a collector thereof and, therefore, operates as a diode. The voltage at the collector of the diode-connected transistor 301 is double $V_{BE}$. This voltage is applied to the base of the bias transistor 202, which is the emitter-follower-type transistor. The collector of the bias transistor 202 is connected to the DC voltage source Vcc. Because the emitter voltage is the base voltage minus $V_{BE}$, the emitter voltage of the bias transistor 202 is equal to $V_{BE}(2V_{BE}-V_{BE}=V_{BE})$. This is the bias voltage applied to the RF transistor 102.

In order to prevent the RF input signal from coupling back to the bias transistor 202 to undesirably drive the bias transistor 202 into a saturation state, an inductor 304 is provided between the emitter of the bias transistor 202 and the base of the RF transistor 102. The inductor 304 blocks the part of the RF input signal coupled back to the bias transistor 202, thereby preventing the bias transistor 202 from being driven into the saturation state. Therefore, the linearity of the RF power amplifier is improved.

Although the inductor 304 effectively blocks the part of the RF input signal coupled back to the bias transistor 202, the block efficiency cannot be 100%. In view of this deficiency, the bias circuit for the RF power amplifier according to the present invention further includes a capacitor 305 and an inductor 306. As shown in FIG. 3(a), the capacitor 305 and the inductor 306 are connected between the emitter of the bias transistor 202 and ground in such a serial manner that the capacitor 305 and the inductor 306 construct an LC series-connected resonator circuit. In this embodiment, the LC series-connected resonator circuit constructed of the capacitor 305 and the inductor 306 is arranged to conduct a second harmonic component of the RF input signal into the ground. Since a resonant frequency of the LC series-connected resonator circuit is determined by impedances of the capacitor 305 and the inductor 306, the individual impedance of the capacitor 305 and the inductor 306 may be appropriately designed in accordance with the frequency of the undesirable second harmonic component, thereby constructing a LC series-connected resonator circuit having a resonant frequency equal to the frequency of the second harmonic component of the RF input signal. Accordingly, when part of the RF input signal is coupled back to the bias transistor 202, the second harmonic component of the RF input signal is directly conducted into the ground through the LC series-connected resonator circuit constructed of the capacitor 305 and the inductor 306. In this way, the bias transistor 202 is prevented from being influenced by the RF input signal, thereby improving the linearity of the RF power amplifier.

It should be noted that although in the above-mentioned embodiment the IC series-connected resonator circuit constructed of the capacitor 305 and the inductor 306 is designed to have the resonant frequency equal to the frequency of the second harmonic component of the RF input signal, the present invention is not limited to this and may be designed to have the resonant frequency equal to a frequency of fundamental, third harmonic, or higher order harmonic components of the RF input signal.

Figure 3B:
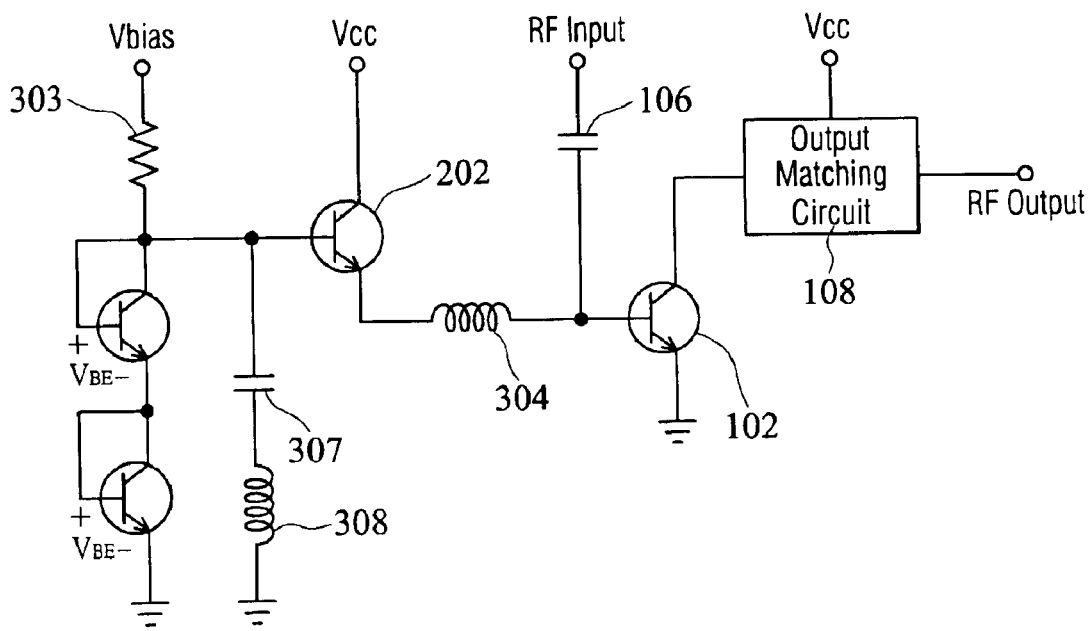
FIG. 3(b) is a schematic diagram showing a bias circuit according to a second embodiment of the present invention.

FIG. 3(b) is a schematic diagram showing a bias circuit for improving linearity of a radio frequency power amplifier according to a second embodiment of the present invention. The bias circuit of the second embodiment is different from that of the first embodiment in that a capacitor 307 and an inductor 308 are employed in the second embodiment to replace the capacitor 305 and the inductor 306 of the first embodiment. Referring to FIG. 3(b), the capacitor 307 and the inductor 308 are connected between the base of the bias transistor 202 and ground in such a serial manner that the capacitor 307 and the inductor 308 construct an LC series-connected resonator circuit. In this embodiment, the LC series-connected resonator circuit constructed of the capacitor 307 and the inductor 308 is arranged to conduct a second harmonic component of the RF input signal into the ground. Since a resonant frequency of the LC series-connected resonator circuit is determined by impedances of the capacitor 307 and the inductor 308, the individual impedance of the capacitor 307 and the inductor 308 may be appropriately designed in accordance with the frequency of the undesirable second harmonic component, thereby constructing a LC series-connected resonator circuit having a resonant frequency equal to the frequency of the second harmonic component of the RF input signal. Accordingly, when part of the RF input signal is coupled back to the bias transistor 202, the second harmonic component of the RF input signal is directly conducted into the ground through the LC series-connected resonator circuit constructed of the capacitor 307 and the inductor 308. In this way, the bias transistor 202 is prevented from being influenced by the RF input signal, thereby improving the linearity of the RF power amplifier.

It should be noted that although in the above-mentioned embodiment the LC series-connected resonator circuit constructed of the capacitor 307 and the inductor 308 is designed to have the resonant frequency equal to the frequency of the second harmonic component of the RF input signal, the present invention is not limited to this and may be designed to have the resonant frequency equal to a frequency of fundamental, third harmonic, or higher order harmonic components of the RF input signal.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A bias circuit for improving linearity of a radio frequency (RF) power amplifier, the RF power amplifier including an RF transistor and a first capacitor, the RF transistor having a collector, an emitter, and a base, the first capacitor having a terminal connected to the base of the RF transistor and another terminal for receiving an RF input signal, the bias circuit comprising:

a bias transistor having a collector, an emitter, and a base, the collector being connected to a DC voltage source and the base being connected to a bias voltage source;

a second capacitor having a first terminal and a second terminal, the first terminal being connected to the emitter of the bias transistor; and a first inductor having a third terminal and a fourth terminal, the third terminal being connected to the second terminal of the second capacitor and the fourth terminal being connected to a ground;

wherein the second capacitor and the first inductor construct a first LC series-connected resonator circuit for directly conducting part of the RF input signal coupled to the bias transistor into the ground, thereby improving linearity of the RF power amplifier.

2. The bias circuit according to claim 1, further comprising:

a second inductor connected between the base of the RE transistor and the emitter of the bias transistor for blocking part of the RF input signal coupled to the bias transistor.

3. The bias circuit according to claim 1, wherein the first LC series-connected resonator circuit is designed to have a resonant frequency equal to a frequency of a second harmonic component of the RF input signal.

4. The bias circuit according to claim 1, further comprising:

a third capacitor having a fifth terminal and a sixth terminal, the fifth terminal being connected to the base of the bias transistor; and a third inductor having a seventh terminal and an eighth terminal, the seventh terminal being connected to the sixth terminal of the third capacitor and the eighth terminal being connected to a ground;

wherein the third capacitor and the third inductor construct a second LC series-connected resonator circuit for directly conducting part of the RF input signal coupled to the bias transistor into the ground, thereby improving linearity of the RF power amplifier.

5. The bias circuit according to claim 4, wherein the second LC series-connected resonator circuit is designed to have a resonant frequency equal to a frequency of a second harmonic component of the RF input signal.

6. The bias circuit according to claim 1, wherein the bias voltage source comprises:

a resistor connected between a supply voltage and the base of the bias transistor; and a plurality of diodes connected in series between the base of the bias transistor and ground for providing a predetermined voltage to the base of the bias transistor.

7. The bias circuit according to claim 6, wherein each of the plurality of diodes is formed by a transistor having a configuration that a base thereof is connected to a collector thereof.

8. A bias circuit for improving linearity of a radio frequency (RF) power amplifier, the RF power amplifier including an RF transistor and a first capacitor, the RF transistor having a collector, an emitter, and a base, the first capacitor having a terminal connected to the base of the RF transistor and another terminal for receiving an RF input signal, the bias circuit comprising:

a bias transistor having a collector, an emitter, and a base, the collector being connected to a DC voltage source and the base being connected to a bias voltage source;

a second capacitor having a first terminal and a second terminal, the first terminal being connected to the base of the bias transistor; and a first inductor having a third terminal and a fourth terminal, the third terminal being connected to the second terminal of the second capacitor and the fourth terminal being connected to a ground;

wherein the second capacitor and the first inductor construct an LC series-connected resonator circuit for directly conducting part of the RF input signal coupled to the bias transistor into the ground, thereby improving linearity of the RF power amplifier.

9. The bias circuit according to claim 8, further comprising:

a second inductor connected between the base of the RF transistor and the emitter of the bias transistor for blocking part of the RF input signal coupled to the bias transistor.

10. The bias circuit according to claim 8, wherein the LC series-connected resonator circuit is designed to have a resonant frequency equal to a frequency of a second harmonic component of the RF input signal.

11. The bias circuit according to claim 8, wherein the bias voltage source comprises:

a resistor connected between a supply voltage and the base of the bias transistor; and a plurality of diodes connected in series between the base of the bias transistor and ground for providing a predetermined voltage to the base of the bias transistor.

12. The bias circuit according to claim 11, wherein each of the plurality of diodes is formed by a transistor having a configuration that a base thereof is connected to a collector thereof.

* * * * *